(12) United States Patent
Chen et al.

(10) Patent No.: US 8,472,209 B2
(45) Date of Patent: Jun. 25, 2013

(54) DEVICE HAVING ANTI-DEMOLITION FUNCTIONS

(75) Inventors: Hui-Shan Chen, Taichung County (TW); Chih-An Peng, Changhua County (TW); Wan-Ru Yang, Taipei County (TW)

(73) Assignee: ZyXEL communications Corp., Hsinchu Science Park, Hsinchu (TW)

( * ) Notice: Subject to any disclaimer, the term of this patent is extended or adjusted under 35 U.S.C. 154(b) by 66 days.

(21) Appl. No.: 12/948,774

(22) Filed: Nov. 18, 2010

(65) Prior Publication Data

US 2012/0033390 A1    Feb. 9, 2012

(30) Foreign Application Priority Data

Aug. 3, 2010  (TW) ................ 99125806 A

(51) Int. Cl.
*H05K 7/14*  (2006.01)
*H05K 5/02*  (2006.01)

(52) U.S. Cl.
CPC .................................. *H05K 5/0208* (2013.01)
USPC ...................... 361/801; 174/138 G

(58) Field of Classification Search
CPC .................................................. H05K 5/0208
USPC ............ 361/810, 807, 801–803; 174/138 D, 174/138 E, 138 G
See application file for complete search history.

(56) References Cited

U.S. PATENT DOCUMENTS

| 4,674,910 | A  | * | 6/1987 | Hayashi .................... 403/408.1 |
| 5,535,098 | A  | * | 7/1996 | Jakob et al. .................... 361/752 |
| 7,471,521 | B2 | * | 12/2008 | Kugimiya et al. ............ 361/810 |
| 2008/0259537 | A1 | * | 10/2008 | Arisaka et al. ................ 361/680 |
| 2010/0039219 | A1 |  | 2/2010 | Peng |

FOREIGN PATENT DOCUMENTS

TW        201009636    3/2010

\* cited by examiner

*Primary Examiner* — Yuriy Semenenko
(74) *Attorney, Agent, or Firm* — Winston Hsu; Scott Margo

(57) ABSTRACT

A device having anti-demolition functions includes a housing and an electronic apparatus. The housing includes a first cover and a second cover. The first cover has a first connection part disposed thereon. The electronic apparatus is disposed in the housing and is fixed on the second cover. The electronic apparatus includes a first block, a second block and a join part. The second block has a second connection part disposed thereon, wherein second connection part fastens first connection part when first cover is engaged with second cover. The join part connects first block and second block, and has at least one circuit wire passing there through, wherein when the first cover and the second cover are separated from each other, the join part is separated from at least one of the first block and the second block, such that the at least one circuit wire forms an open circuited status.

8 Claims, 16 Drawing Sheets

DEVICE HAVING ANTI-DEMOLITION FUNCTIONS

BACKGROUND OF THE INVENTION

1. Field of the Invention

The present invention relates to an electronic apparatus, and more particularly, to an electronic apparatus having anti-demolition functions.

2. Description of the Prior Art

In general, a housing of an electronic apparatus is mostly formed by way of docking an upper cover and a lower cover so as to cover its circuit board and related electronic components thereon. Actually, in order to prevent the problems caused from that users dismantle the entire housing of the electronic apparatus by themselves, the manufactures of the electronic apparatus are dedicated to design the anti-demolition mechanism for the electronic apparatus. For example, after a bad user dismantles the housing of the electronic apparatus and discredits the internal circuits or the mechanism, he further alleges that the electronic apparatus is a defective product and attempts to influence the industry goodwill and make a fraudulent claim. Or the user may dismantle the housing of the electronic apparatus so as to use some circuit functions inside the electronic apparatus.

Hence, how to provide a device that can firmly fasten an anti-dismantle fastener with the electronic apparatus so as to prevent malicious damages caused from attempts for dismantling the electronic apparatus, has become an important topic to be solved to the related manufactures.

SUMMARY OF THE INVENTION

It is one of the objectives of the claimed invention to provide a device having anti-demolition functions to solve the abovementioned problems.

According to an aspect of the present invention, a device having anti-demolition functions. A device having anti-demolition functions includes a housing and an electronic apparatus. The housing includes a first cover and a second cover. The first cover has a first connection part disposed thereon. The electronic apparatus is disposed in the housing and is fixed on the second cover. The electronic apparatus includes a first block, a second block and a join part. The second block has a second connection part disposed thereon, wherein the second connection part fastens the first connection part when the first cover is engaged with the second cover. The join part connects the first block and the second block, and has at least one circuit wire passing there through, wherein when the first cover and the second cover are separated from each other, the join part is separated from at least one of the first block and the second block, such that the at least one circuit wire forms an open circuited status.

Therefore, by use of the mechanism that the join part will be broken off and separated from at least one of the first block and the second block so as to facilitate at least one circuit wire form an open circuited status when the first cover and the second cover of the housing are separated from each other, attempts for dismantling the electronic apparatus and derived malicious damages can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
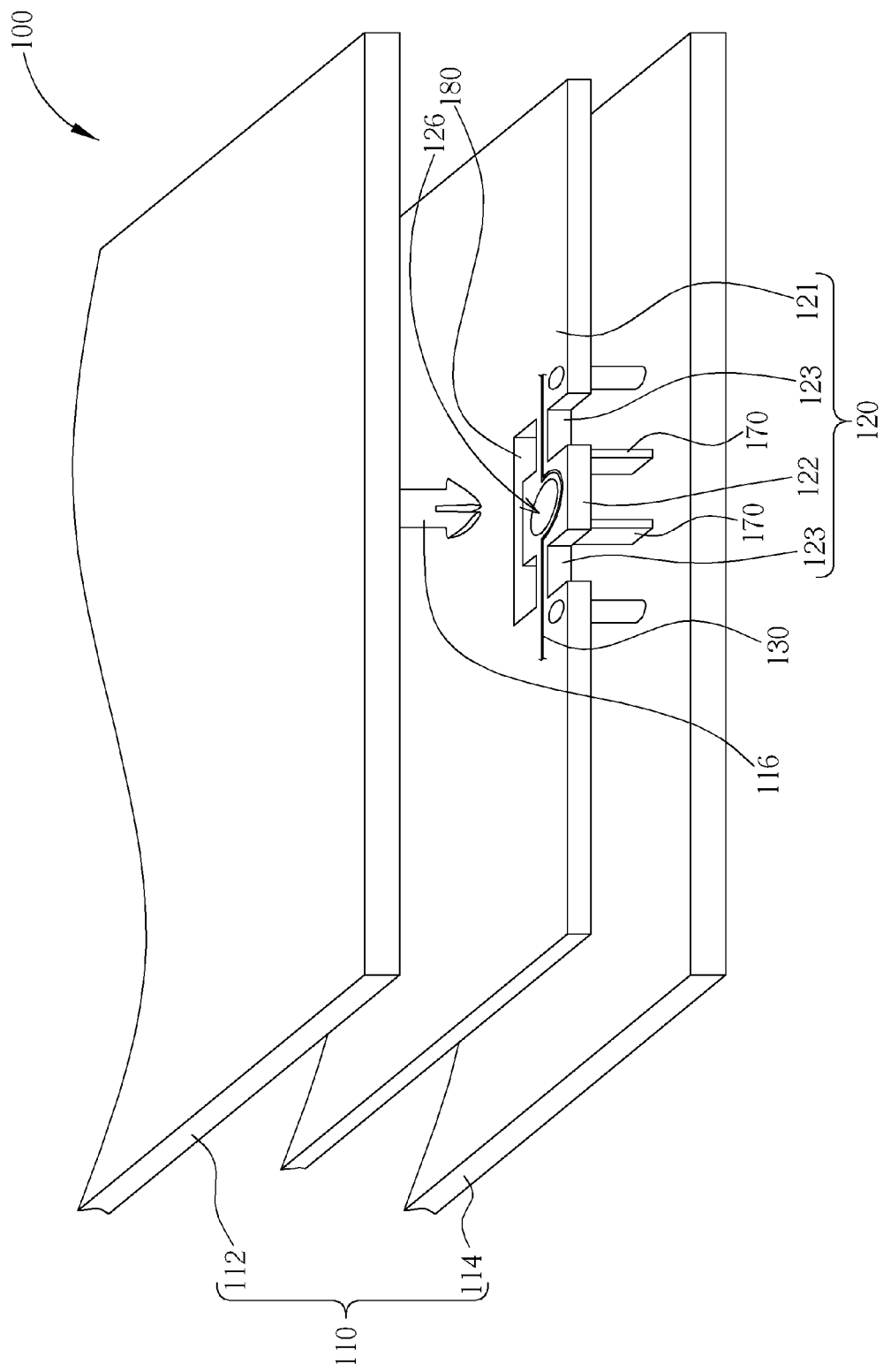
FIG. 1A is an exploded view illustrating principal components of a device having anti-demolition functions according to an embodiment of the present invention.

Please refer to FIG. 1A. FIG. 1A is an exploded view illustrating principal components of a device 100 having anti-demolition functions according to an embodiment of the present invention. The device 100 having anti-demolition functions includes, but is not limited to, a housing 110 and an electronic apparatus 120. The housing 110 includes a first cover 112 and a second cover 114, wherein the first cover 112 has a first connection part 116 disposed thereon. The electronic apparatus 120 is disposed in the housing 110 and fixed on the second cover 114. The electronic apparatus 120 includes, but is not limited to, a first block 121, a second block 122, and a join part 123. The second block 122 has a second connection part 126 disposed thereon, wherein the second connection part 126 fastens the first connection part 116 of the first cover 112 when the first cover 112 is engaged with the second cover 114. In this embodiment, the first connection part 116 may be implemented by an anti-dismantle fastener, and the second connection part 126 may implemented by a hole. That is to say, when the first cover 112 is engaged with the second cover 114 of the housing 110, the first connection part 116 (i.e., the anti-dismantle fastener) is inserted into the second connection part 126 (i.e., the hole) in order to fasten each other.

Please note that, at least one of the first block 121 and the second block 122 may be a printed circuited board. However, this embodiment is presented merely for describing the present invention, but this is not a limitation of the present invention. Furthermore, the join part 123 is arranged to connect the first block 121 and the second block 122. The join part 123 has at least one circuit wire 130 passing through, wherein when the first cover 112 and the second cover 114 are separated from each other, the join part 123 is separated from at least one of the first block 121 and the second block 122, such that the at lest one circuit wire 130 forms an open circuited status.

Figure 1B:
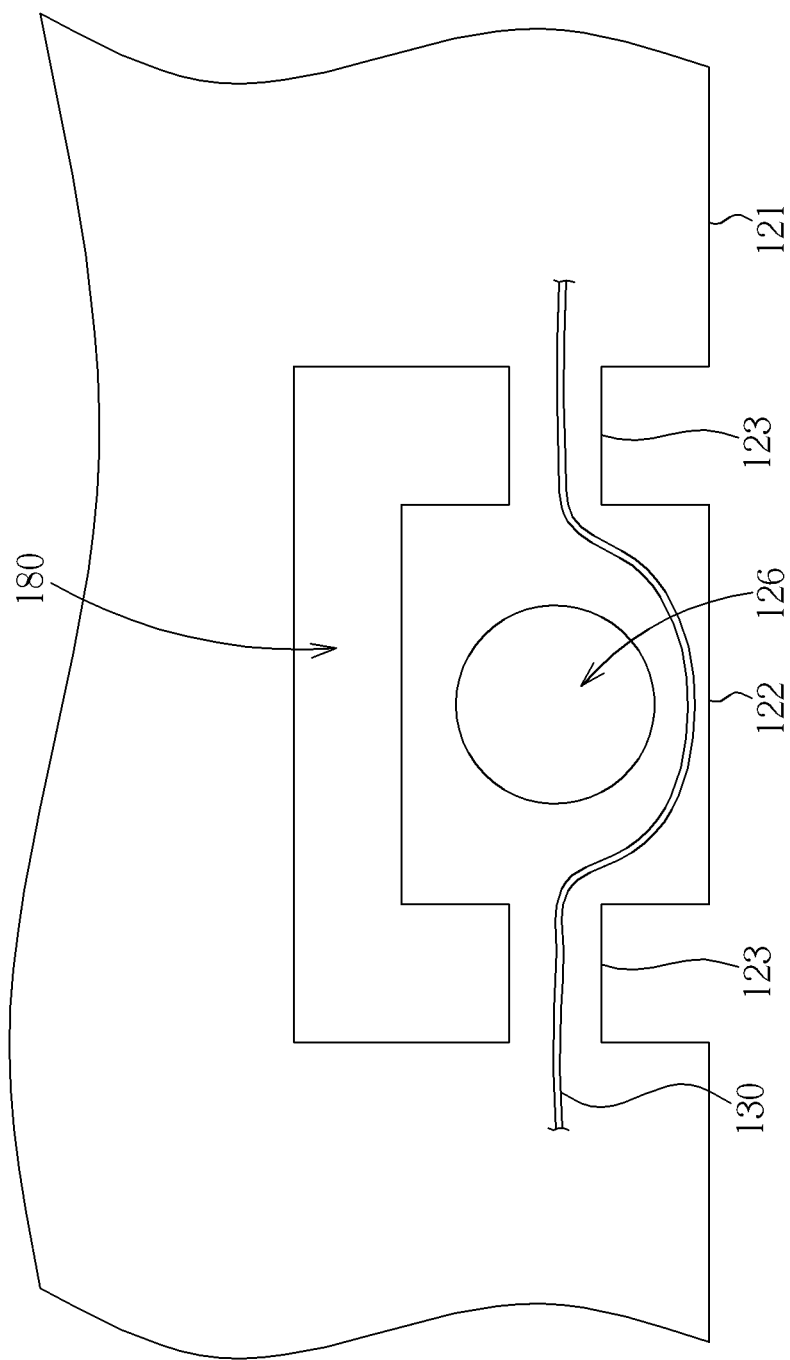
FIG. 1B is an enlarged view of an electronic apparatus according to a first embodiment of the present invention.

Please also refer to FIG. 1B. FIG. 1B is an enlarged view of an electronic apparatus 120 according to a first embodiment of the present invention. As shown in FIG. 1B, there is a U-type groove 180 existed between the first block 121 and the second block 122. In this embodiment, when the first cover 112 is separated from the second cover 114 of the housing 110, the shape of the U-type groove 180 will produce a force acting on the join part 123 in order to break the join part 123 off more easily, but the present invention is not limited to this only. Certainly, people skilled in the art will readily appreciate that other structures for implementing the join part 123, the first block 121, and the second block 122 are feasible without departing from the spirit of the present invention, as long as a goal of easily breaking the join part 123 off can be achieved, which also belongs to the scope of the present invention.

Figure 2:
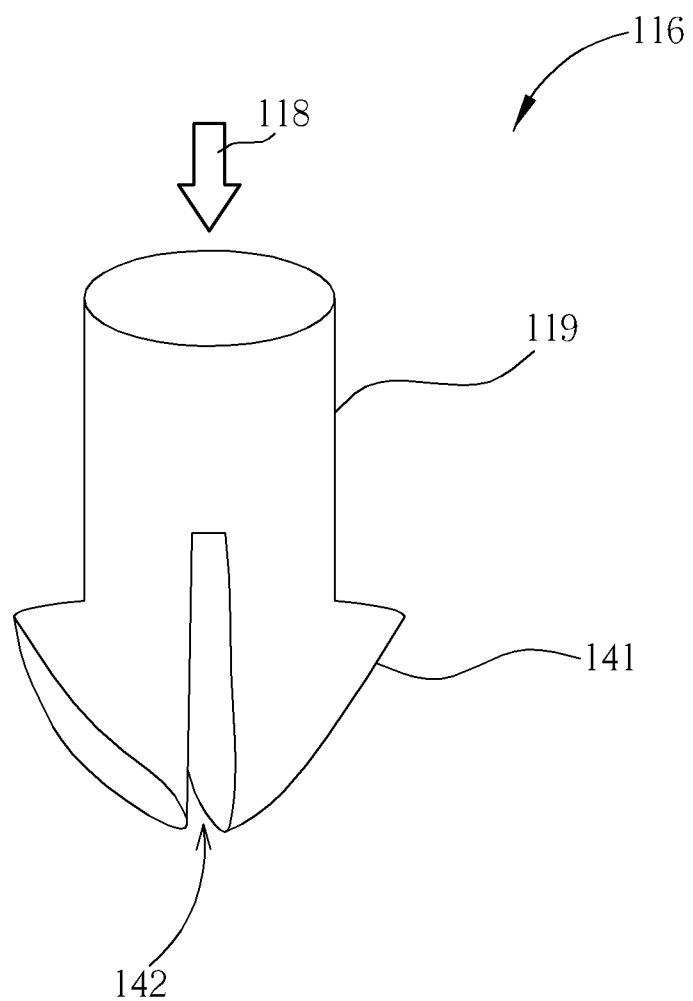
FIG. 2 is an enlarged view of the first connection part shown in FIG. 1A.

Please refer to FIG. 2. FIG. 2 is an enlarged view of the first connection part 116 shown in FIG. 1A. In this embodiment, the first connection part 116 is implemented by an anti-dismantle fastener. For example, the anti-dismantle fastener can be a cylindrical object formed by plastic injection molding, but this is not meant to be a limitation of the present invention. As shown in FIG. 2, an axis 118 of the first connection part 116 (i.e., the anti-dismantle fastener) includes a pillar 119, wherein a top of the pillar 119 includes at least one blocking part 141 disposed outwardly and a gap 142 disposed inwardly. Be noted that when the first connection part 116 (i.e., the anti-dismantle fastener) is inserted into the second connection part 126 (e.g., a hole), the blocking part 141 penetrates the second connection part 126 (e.g., the hole) and fastens it.

Figure 3:
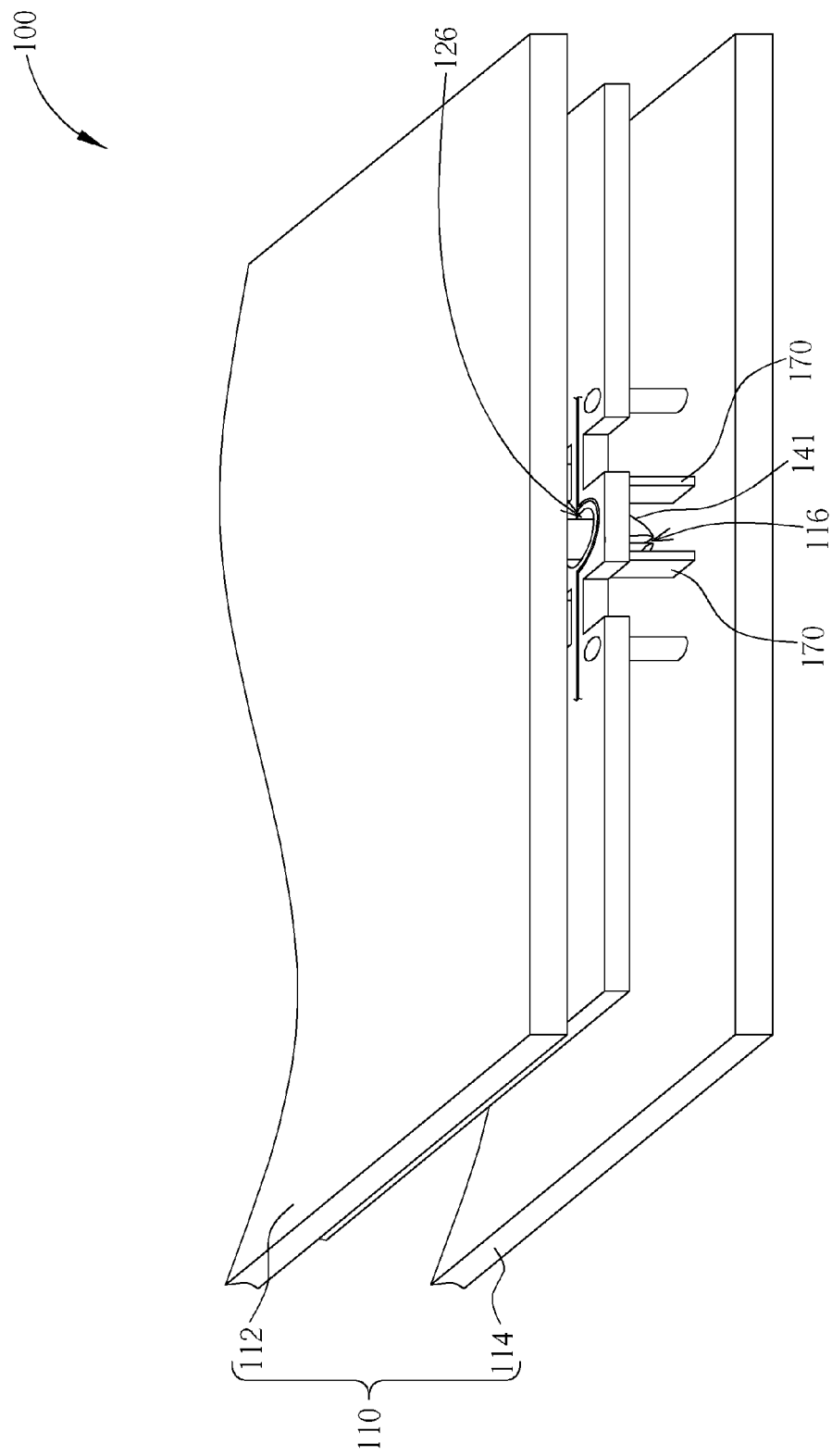
FIG. 3 is a diagram showing a condition that the anti-dismantle fastener is inserted into the hole in order to fasten each other shown in FIG. 1A.

Please refer to FIG. 1A again. As shown in FIG. 1A, the first connection part 116 may be implemented by an anti-dismantle fastener, and the second connection part 126 may be implemented by the hole. What calls for special attention is that: when the first cover 112 is engaged with the second cover 114 of the housing 110, the first connection part 116 (i.e., the anti-dismantle fastener) is inserted into the second connection part 126 in order to fasten each other. As shown in FIG. 3, which is a diagram showing a condition that the anti-dismantle fastener is inserted into the hole in order to fasten each other shown in FIG. 1A.

Please note that, adopting an anti=dismantle fastener to implement the first connection part 116 and adopting a hole to implement the second connection is merely an embodiment for describing the present invention. Certainly, people skilled in the art will readily appreciate that any type/structure for implementing the first connection part 116 and the second connection part 126 are feasible without, as long as a goal of separating the join part 123 from at least one of the first block 121 and the second block 122 can be achieved, which also belongs to the scope of the present invention.

Please refer to FIG. 1A and FIG. 3 again. In order to protect the electronic apparatus 120 and prevent damaging the first block 121, the second block 122 and/or the join part 123 when the first connection part 116 fastens the second connection part 126, at least one supporting stilt 170 (see FIG. 1A and FIG. 3) for supporting the second block 122 can be disposed on the second cover 114. However, this is merely a practice embodiment of the present invention, and in no way should be considered to be limitations of the scope of the present invention. In other embodiment, the supporting stilt 170 can be optional.

Figure 4:
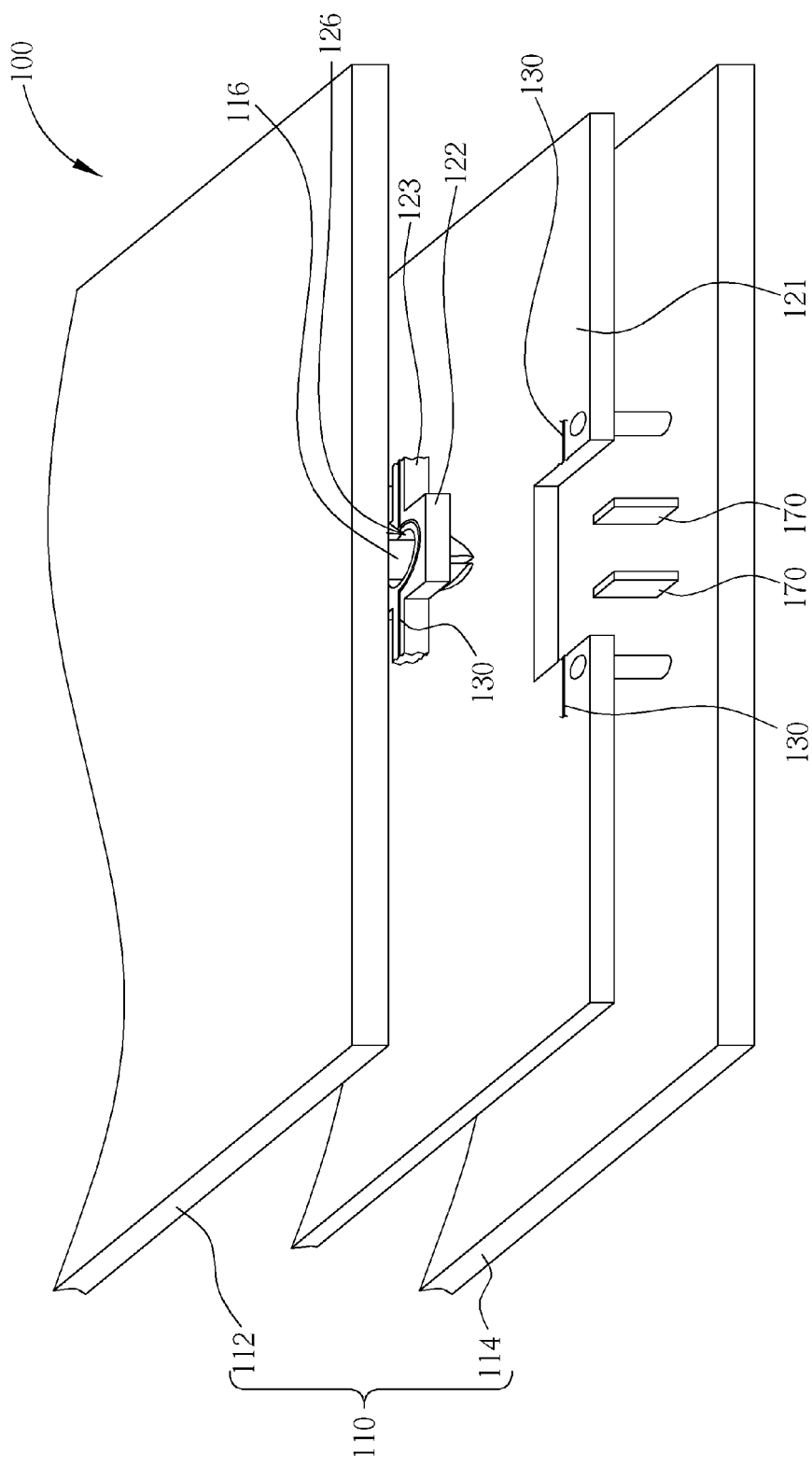
FIG. 4 is a diagram showing a condition that the join part is separated from at least one of the first block and the second block according to an embodiment of the present invention.

Please refer to FIG. 4. FIG. 4 is a diagram showing a condition that the join part 123 is separated from at least one of the first block 121 and the second block 122 according to an embodiment of the present invention. As shown in FIG. 4, when the first cover 112 and the second cover 114 of the housing 110 are separated from each other, the join part 123 is separated from at least one of the first block 121 and the second block 122, such that the at least one circuit wire 130 forms an open circuited status. However, in FIG. 4, the separated position(s) that the join part 123 is separated from at least one of the first block 121 and the second block 122 is merely an embodiment for describing the present invention, and in no way should be considered as a limitation of the scope of the present invention.

Figure 5A:
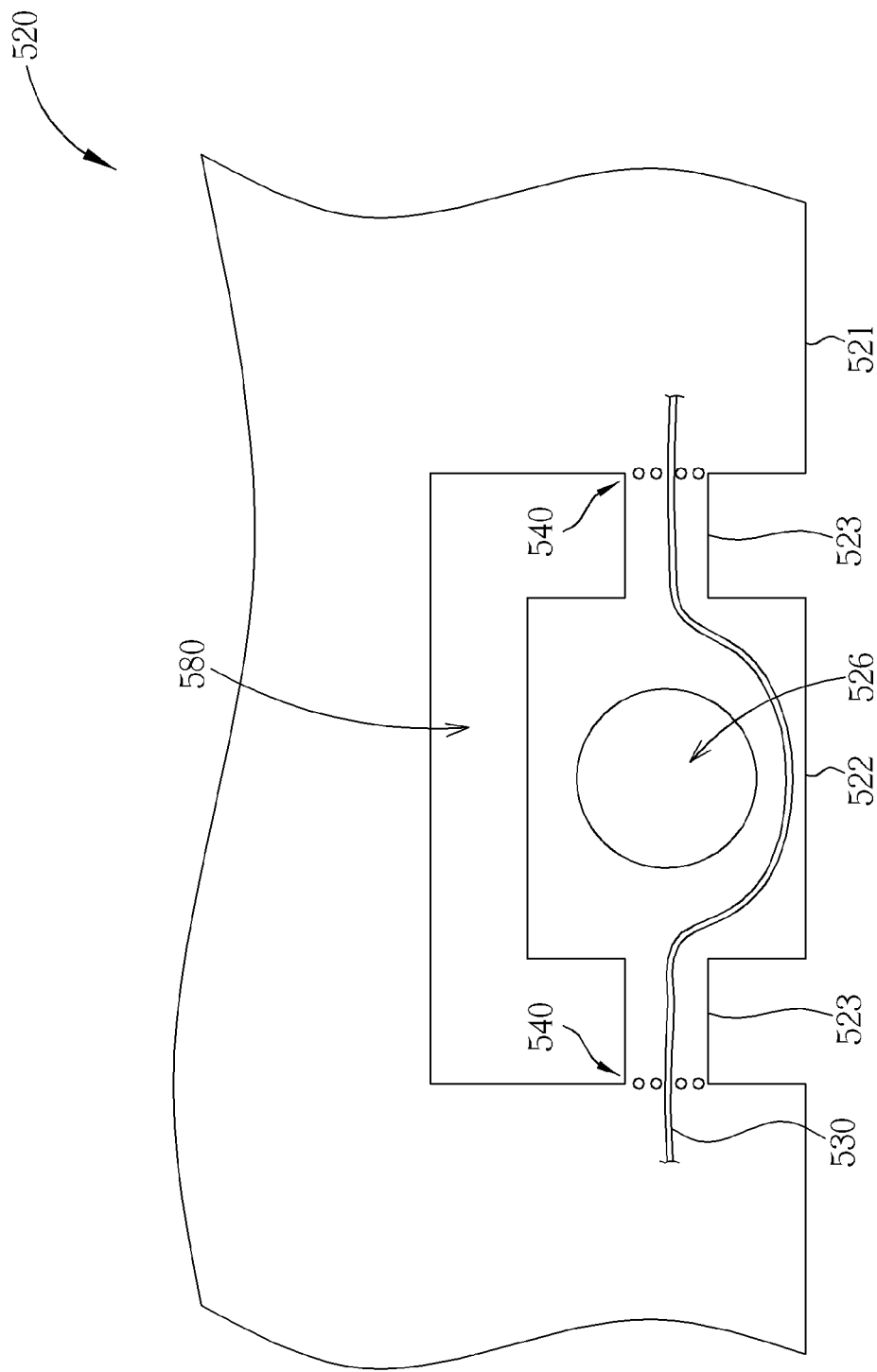
FIG. 5A is an enlarged view of an electronic apparatus according to a second embodiment of the present invention.
Figure 5B:
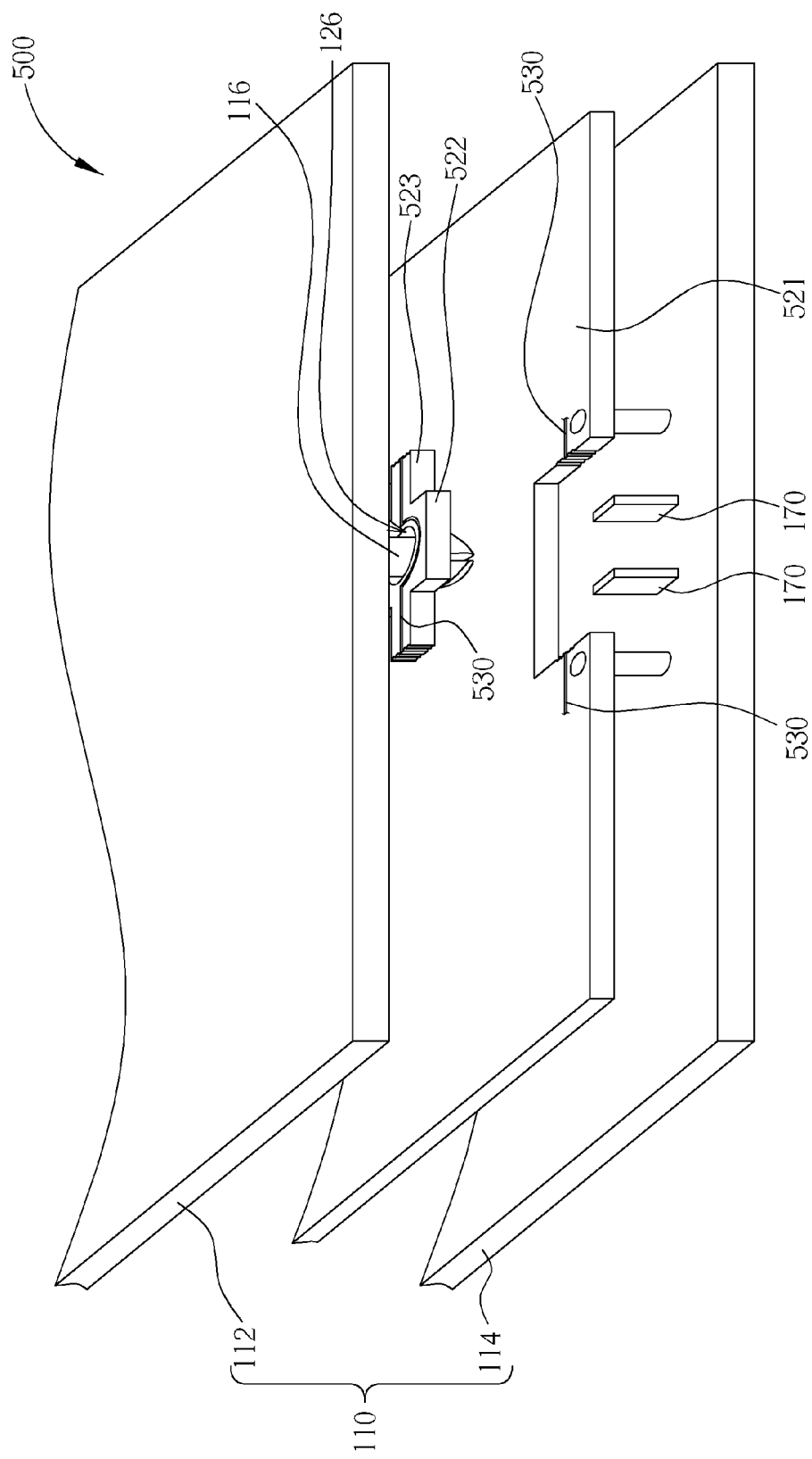
FIG. 5B is a diagram showing a condition that the join part is separated from at least one of the first block and the second block shown in FIG. 5A according to an embodiment of the present invention.

Please refer to FIG. 5A together with FIG. 5B. FIG. 5A is an enlarged view of an electronic apparatus 520 according to a second embodiment of the present invention. In this embodiment, components with similar functions or the same functions are represented by similar symbols, and further description is omitted here for brevity. As shown in FIG. 5A, the architecture of the electronic apparatus 520 is similar to that of the electronic apparatus 120 shown in FIG. 1B, and the major difference between them is that the join part 523 shown in FIG. 5A further includes at least one broken line 540 (such as, dotted line holes of stamp holes) in order to facilitate break the join part 523 off more easily when the first cover 112 and the second cover 114 of the housing 110 are separated from each other, such that at least one circuit wire 530 forms an open circuited status. Please refer to FIG. 5B, which is a diagram showing a condition that the join part 523 is separated from at least one of the first block 521 and the second block 522 shown in FIG. 5A according to an embodiment of the present invention. As shown in FIG. 5B, the device 500 having anti-demolition functions adopts the electronic apparatus 520 as the embodiment. The architecture of the device 500 shown in FIG. 5B is similar to that of the device 100 shown in FIG. 4, and the major difference between them is that the join part 523 is directly snapped along the direction of the broken line 540 by use of the force generated from dismantling the first cover 112 and the second cover 114. As a result, the join part 523 is separated from at least one of the first block 521 and the second block 522, such that the at least one circuit wire 530 forms an open circuited status.

Figure 6A:
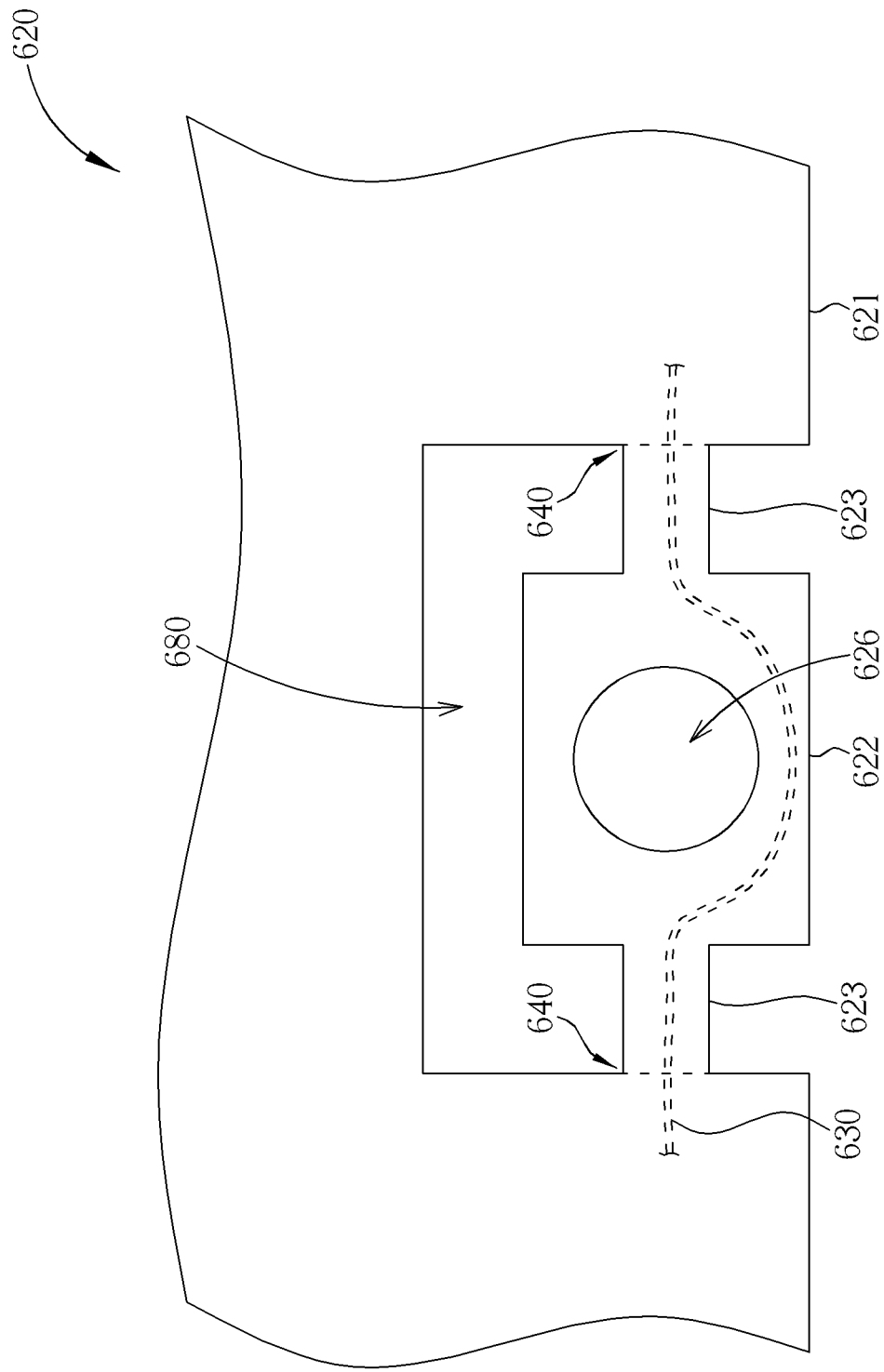
FIG. 6A is an enlarged view of an electronic apparatus according to a third embodiment of the present invention.
Figure 6B:
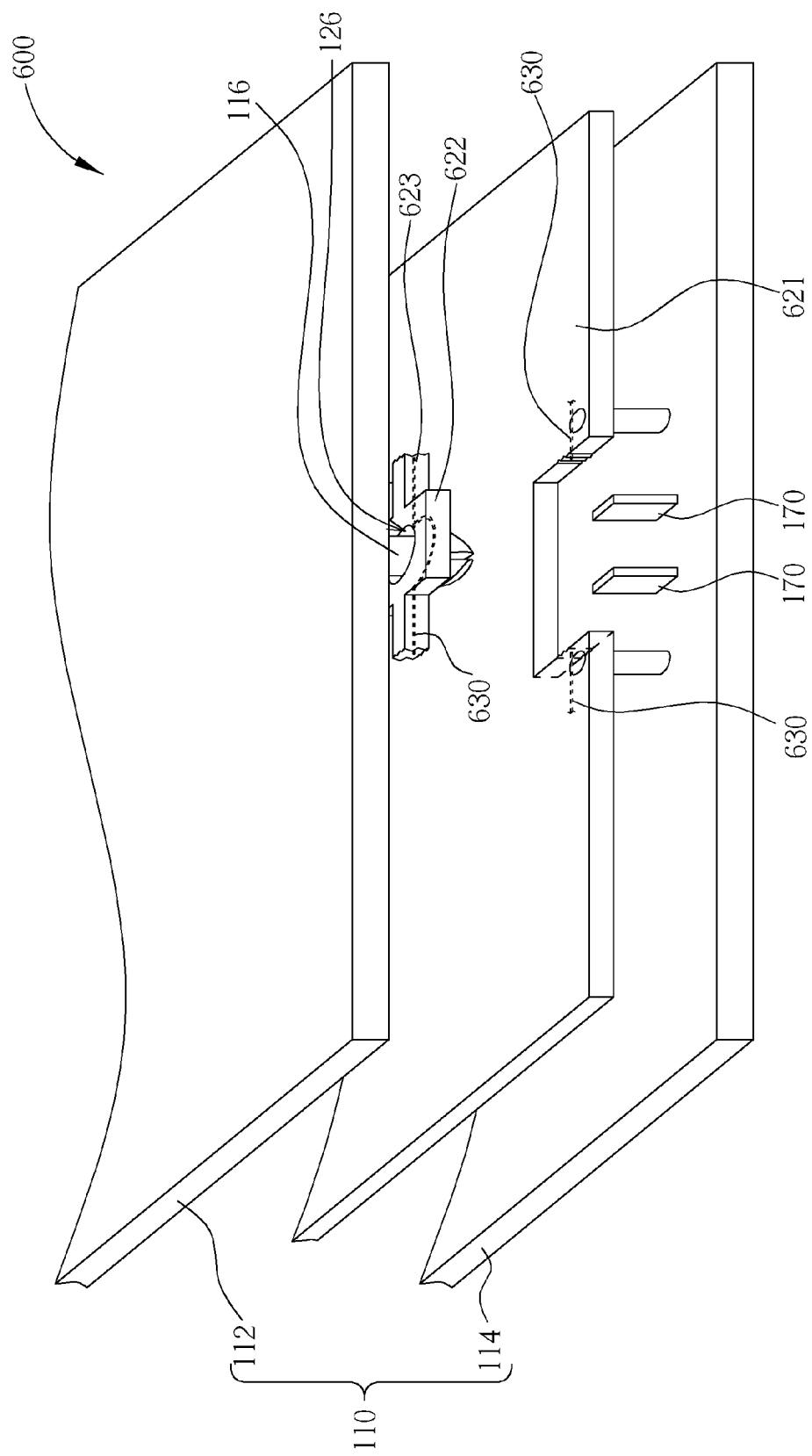
FIG. 6B is a diagram showing a condition that the join part is separated from at least one of the first block and the second block shown in FIG. 6A according to an embodiment of the present invention.

Please refer to FIG. 6A together with FIG. 6B. FIG. 6A is an enlarged view of an electronic apparatus 620 according to a third embodiment of the present invention. In this embodiment, components with similar functions or the same functions are represented by similar symbols, and further description is omitted here for brevity. As shown in FIG. 6A, the architecture of the electronic apparatus 620 is similar to that of the electronic apparatus 520 shown in FIG. 5A, and the major difference between them is that: the circuit wire 630 is routed on an inner layer of the join part 623 shown in FIG. 6A, and the join part 623 further includes at least one broken line 640 in order to facilitate break the join part 623 off more easily when the first cover 112 and the second cover 114 of the housing 110 are separated from each other. As a result, the join part 623 is separated from at least one of the first block 621 and the second block 622 along the direction of the broken line 640, such that at least one circuit wire 630 forms an open circuited status. Please refer to FIG. 6B, which is a diagram showing a condition that the join part 623 is separated from at least one of the first block 621 and the second block 622 shown in FIG. 6A according to an embodiment of the present invention. As shown in FIG. 6B, the device 600 having anti-demolition functions adopts the electronic apparatus 620 as the embodiment. As the architecture of the device 600 shown in FIG. 6B is similar to that of the device 500 shown in FIG. 5B, and operations related to the device 600 are easily known to those skilled in the art, and further description is omitted here for brevity.

Figure 7A:
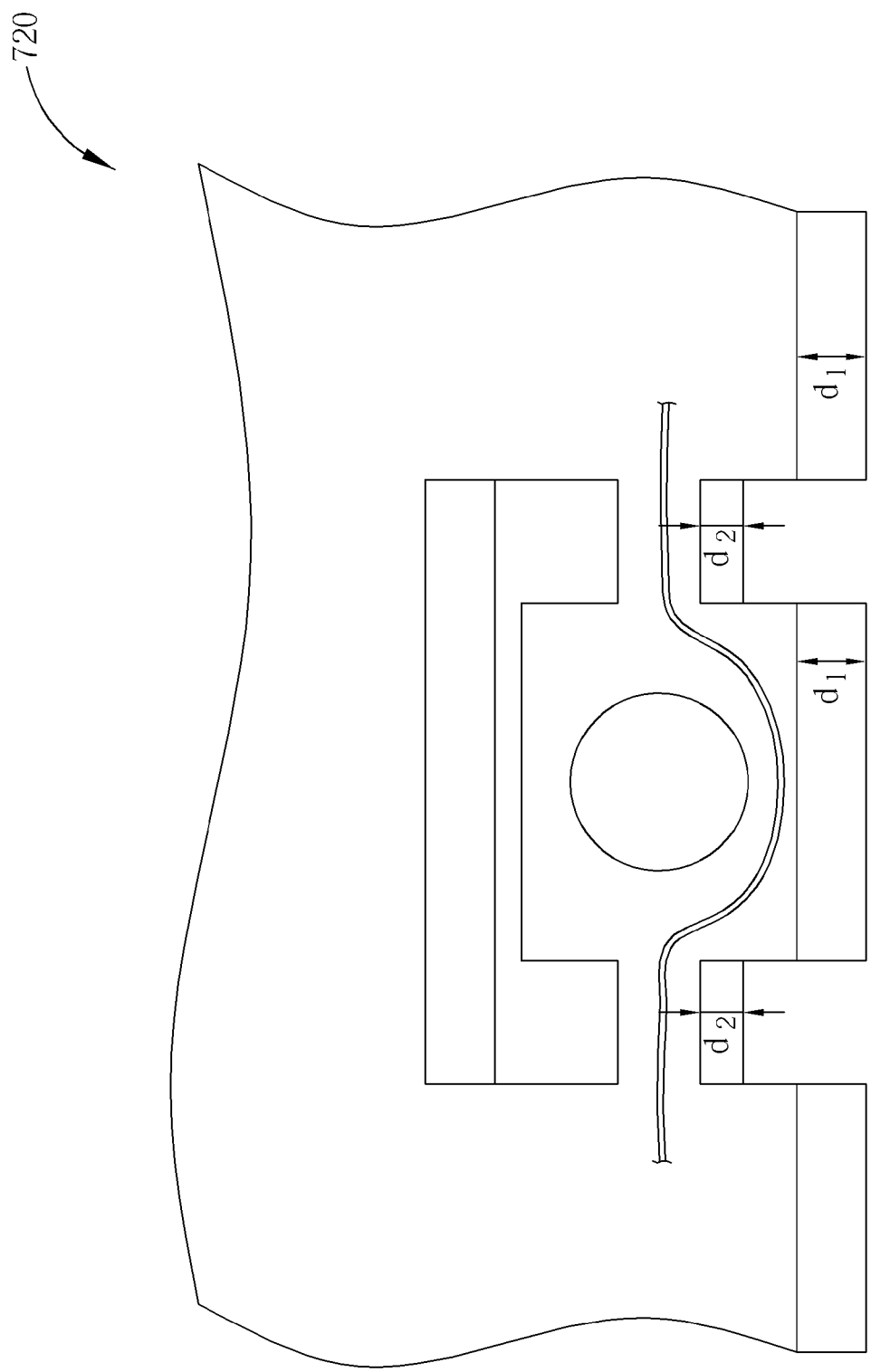
FIG. 7A is an enlarged view of an electronic apparatus according to a fourth embodiment of the present invention.
Figure 7B:
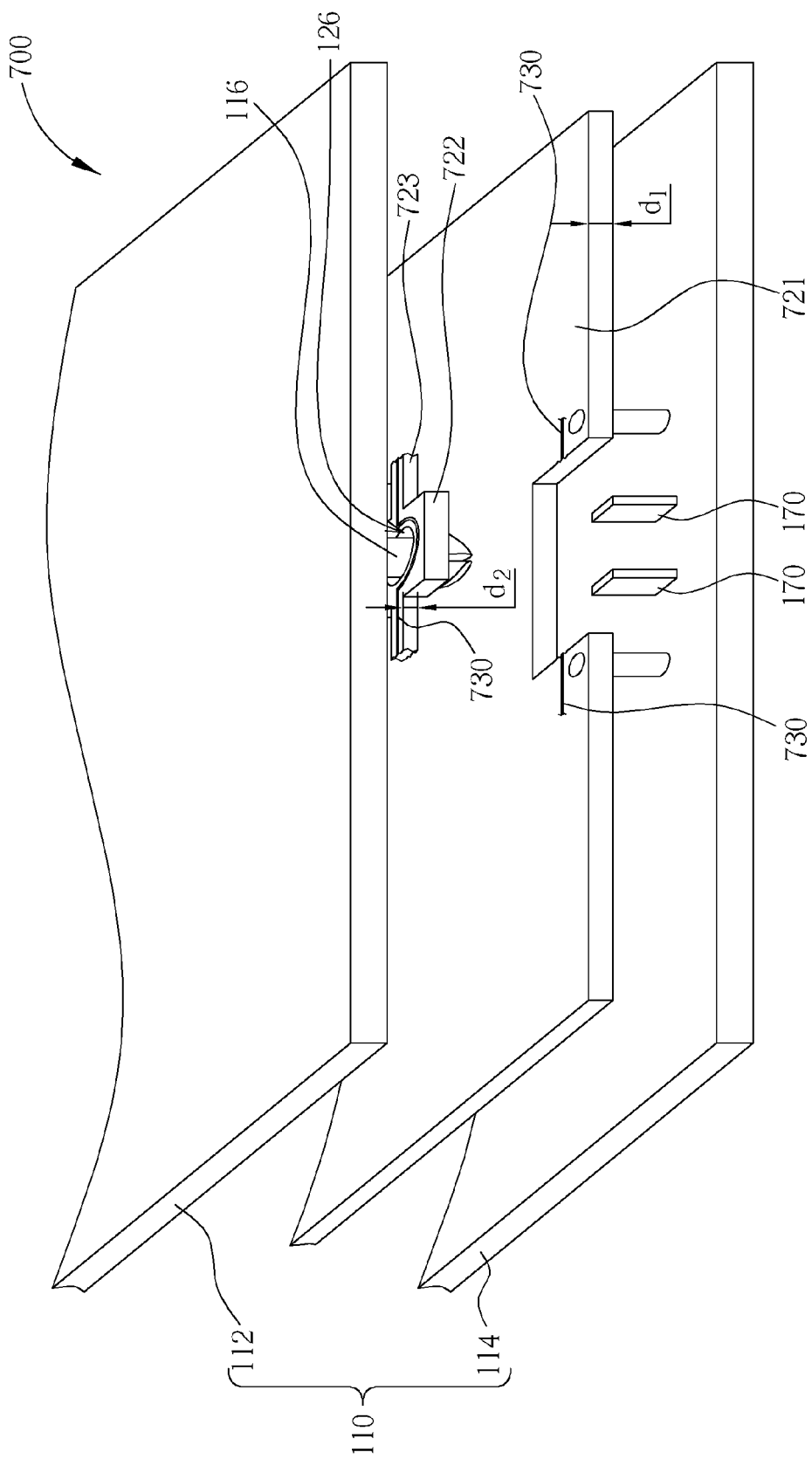
FIG. 7B is a diagram showing a condition that the join part is separated from at least one of the first block and the second block shown in FIG. 7A according to an embodiment of the present invention.

Please refer to FIG. 7A together with FIG. 7B. FIG. 7A is an enlarged view of an electronic apparatus 720 according to a fourth embodiment of the present invention. In this embodiment, components with similar functions or the same functions are represented by similar symbols, and further description is omitted here for brevity. In order to facilitate separate the join part 723 from at least one of the first block 721 and the second block 722 when the first cover 112 and the second cover 114 of the housing 110 are separated from each other, therefore, in this embodiment, each of the first block 721 and the second block 722 is designed to have a first width d1, the join part 723 is designed to have a second width d2, and the second width d2 is smaller than the first width d1 (i.e., d2<d1), such that the connection strength between the join part 723 and the first block 721 and the second block 722 can be reduced. For this reason, when dismantling the first cover 112 and the second cover 114 of the housing 110, the join part 723 can be directly snapped by use of the force generated from dismantling them. Please refer to FIG. 7B, which is a diagram showing a condition that the join part 723 is separated from at least one of the first block 721 and the second block 722 shown in FIG. 7A according to an embodiment of the present invention. As shown in FIG. 7B, the device 700 having anti-demolition functions adopts the electronic apparatus 720 as the embodiment. As the architecture of the device 700 shown in FIG. 7B is similar to that of the device 100 shown in FIG. 4, and operations related to the device 700 are easily known to those skilled in the art, and further description is omitted here for brevity.

Please note that: the second width d2 of the join part 723 being smaller than the first width d1 of the first block 721 and the second block 722 is merely a practical embodiment of the electronic apparatus 720, but the present invention is not limited to this only. Any designs equipped with functions of separating the join part 723 from at least one of the first block 721 and the second block 722 when the first cover 112 and the second cover 114 of the housing 110 are separated from each other can be adopted in the present invention, wherein the second width d2 can be designed to be smaller than the first width d1. Therefore, the join part 723 can be directly snapped by use of the force generated from dismantling the first cover 112 and the second cover 114 of the housing 110.

Figure 8A:
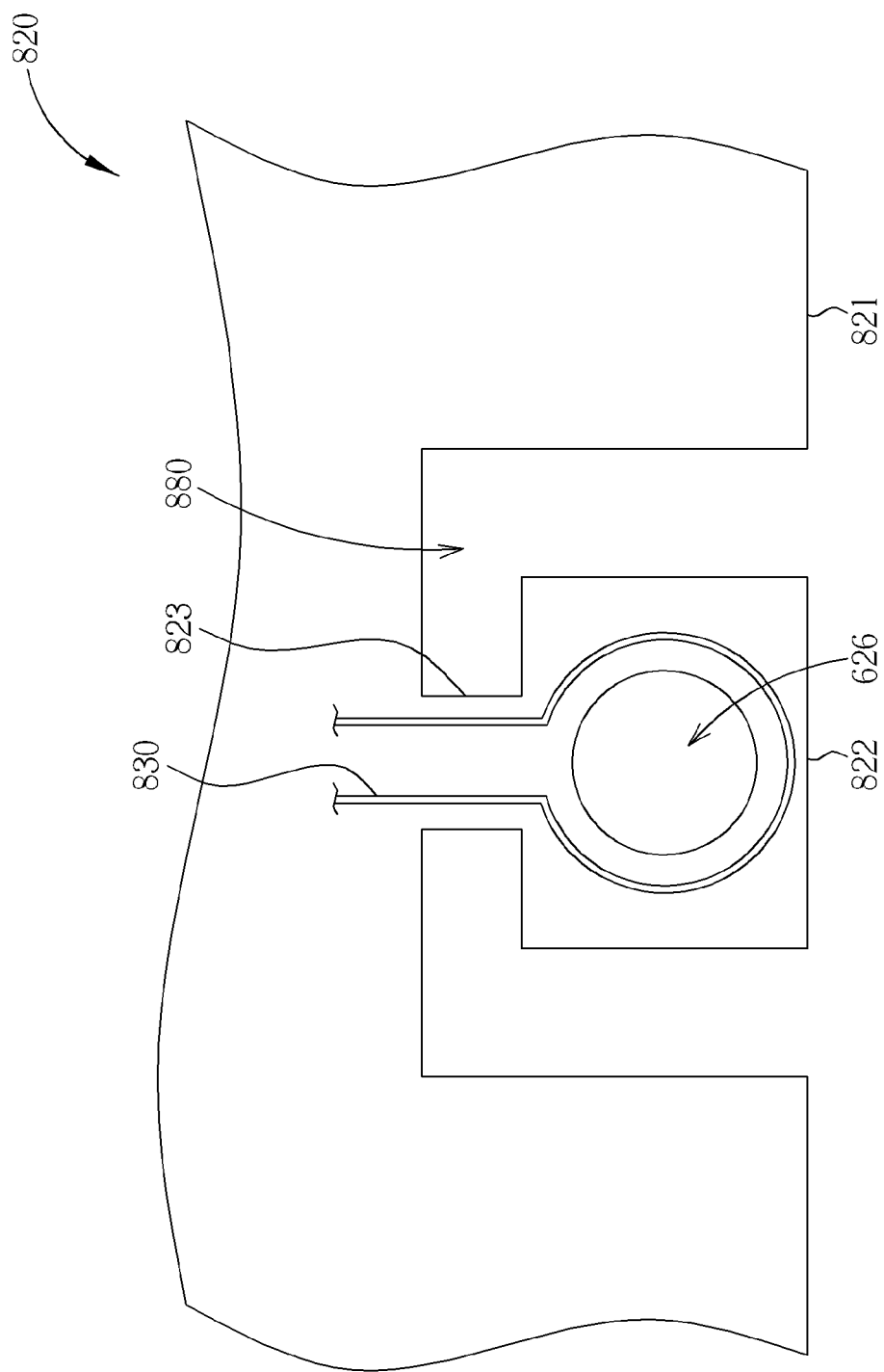
FIG. 8A is an enlarged view of an electronic apparatus according to a fifth embodiment of the present invention.
Figure 8B:
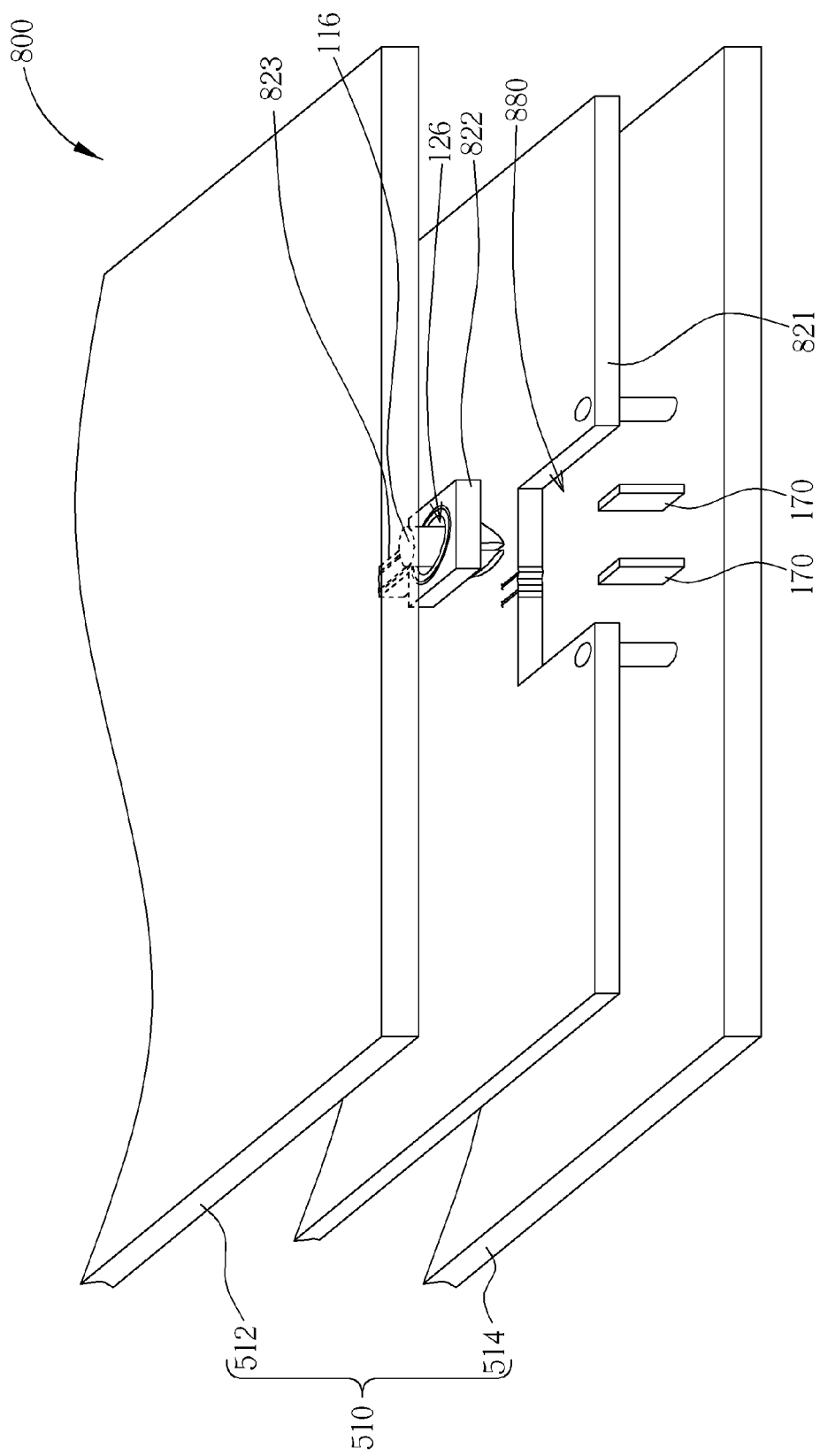
FIG. 8B is a diagram showing a condition that the join part is separated from at least one of the first block and the second block shown in FIG. 8A according to an embodiment of the present invention.

Please refer to FIG. 8A together with FIG. 8B. FIG. 8A is an enlarged view of an electronic apparatus 820 according to a fifth embodiment of the present invention. In this embodiment, components with similar functions or the same functions are represented by similar symbols, and further description is omitted here for brevity. The architecture of the electronic apparatus 820 shown in FIG. 8A is similar to that of the electronic apparatus 120 shown in FIG. 1B, and the major difference between them is that there is at least an L-type groove 880 existed between the first block 821 and the second block 822 shown in FIG. 8A. Please refer to FIG. 8B, which is a diagram showing a condition that the join part 823 is separated from at least one of the first block 821 and the second block 822 shown in FIG. 8A according to an embodiment of the present invention. As shown in FIG. 8B, the device 800 having anti-demolition functions adopts the electronic apparatus 820 as the embodiment. As the architecture of the device 800 shown in FIG. 8B is similar to that of the device 100 shown in FIG. 4, and operations related to the device 800 are easily known to those skilled in the art, and further description is omitted here for brevity.

Figure 9A:
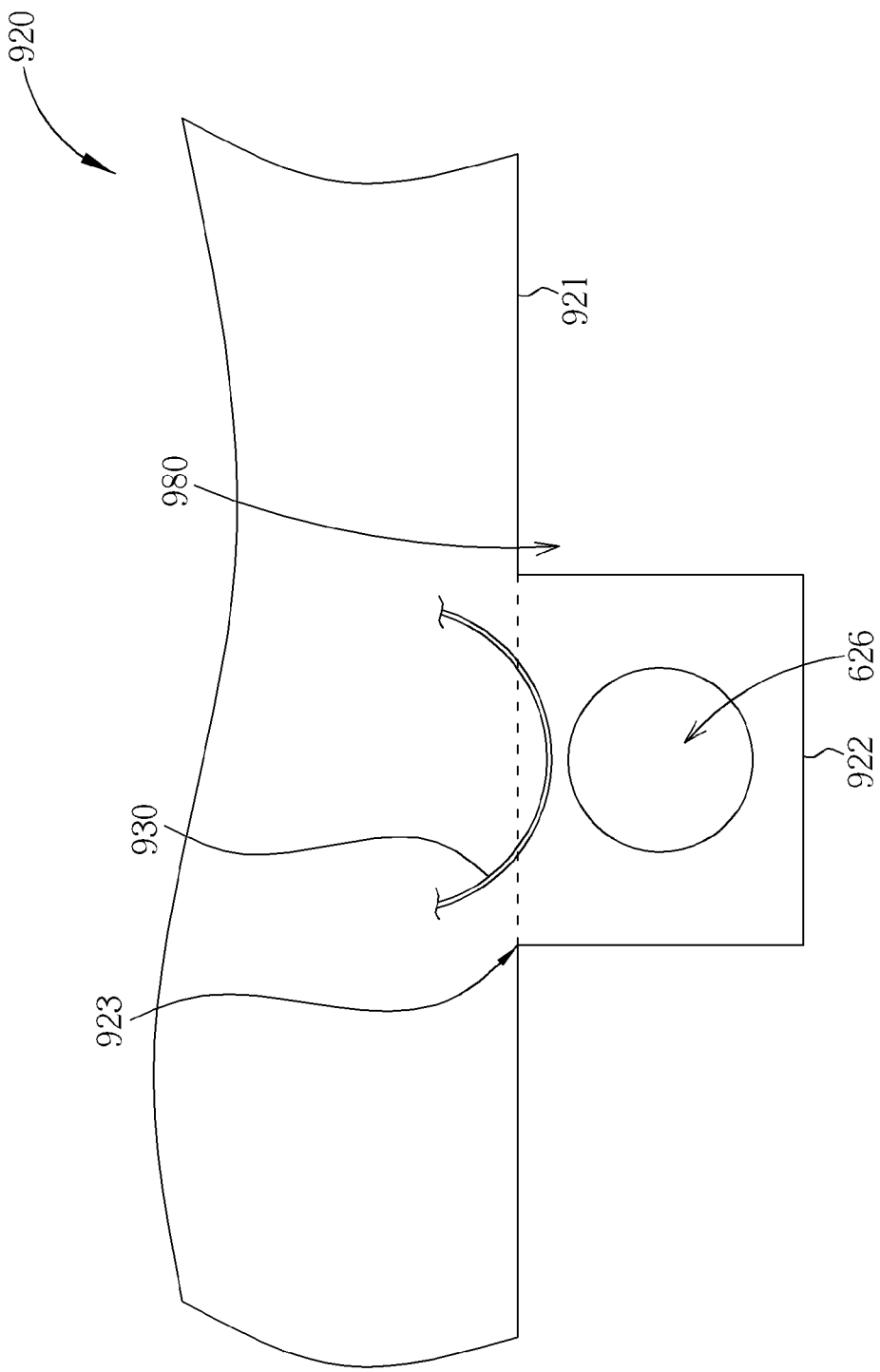
FIG. 9A is an enlarged view of an electronic apparatus according to a sixth embodiment of the present invention.
Figure 9B:
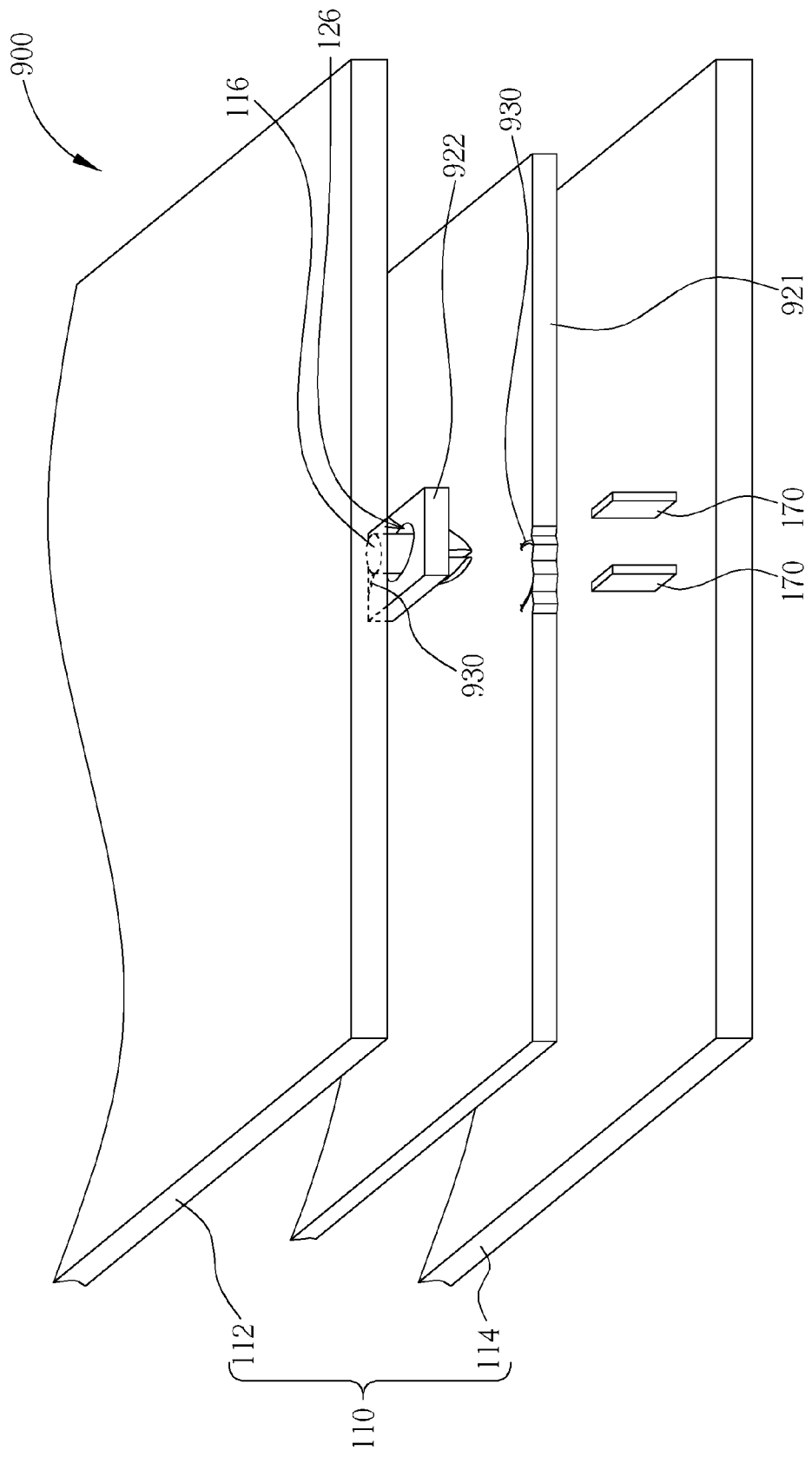
FIG. 9B is a diagram showing a condition that the join part is separated from at least one of the first block and the second block shown in FIG. 9A according to an embodiment of the present invention.

Please refer to FIG. 9A. FIG. 9A is an enlarged view of an electronic apparatus 920 according to a sixth embodiment of the present invention. In this embodiment, components with similar functions or the same functions are represented by similar symbols, and further description is omitted here for brevity. The architecture of the electronic apparatus 920 shown in FIG. 9A is similar to that of the electronic apparatus 120 shown in FIG. 1B, and the major difference between them is that the join part 923 may be a weakening region (such as, dotted line holes of stamp holes, or the join part 923 includes at least one broken line and the circuit wire 940 is routed on an inner layer of the weakening region). For this reason, when the first cover 112 and the second cover 114 of the housing 110 are separated from each other, the join part 923 is separated from at least one of the first block 921 and the second block 922, such that the at least one circuit wire 930 forms an open circuited status. Please refer to FIG. 9B, which is a diagram showing a condition that the join part 923 is separated from at least one of the first block 921 and the second block 922 shown in FIG. 9A according to an embodiment of the present invention. As shown in FIG. 9B, the device 900 having anti-demolition functions adopts the electronic apparatus 920 as the embodiment. The architecture of the device 900 shown in FIG. 9B is similar to that of the device 100 shown in FIG. 4, and the major difference between them is that: the join part 923 is directly snapped by use of the force generated from dismantling the first cover 112 and the second cover 114 when the first cover 112 and the second cover 114 of the housing 110 are separated from each other. As a result, the join part 923 is separated from at least one of the first block 921 and the second block 922, such that the at least one circuit wire 930 forms an open circuited status.

Figure 10:
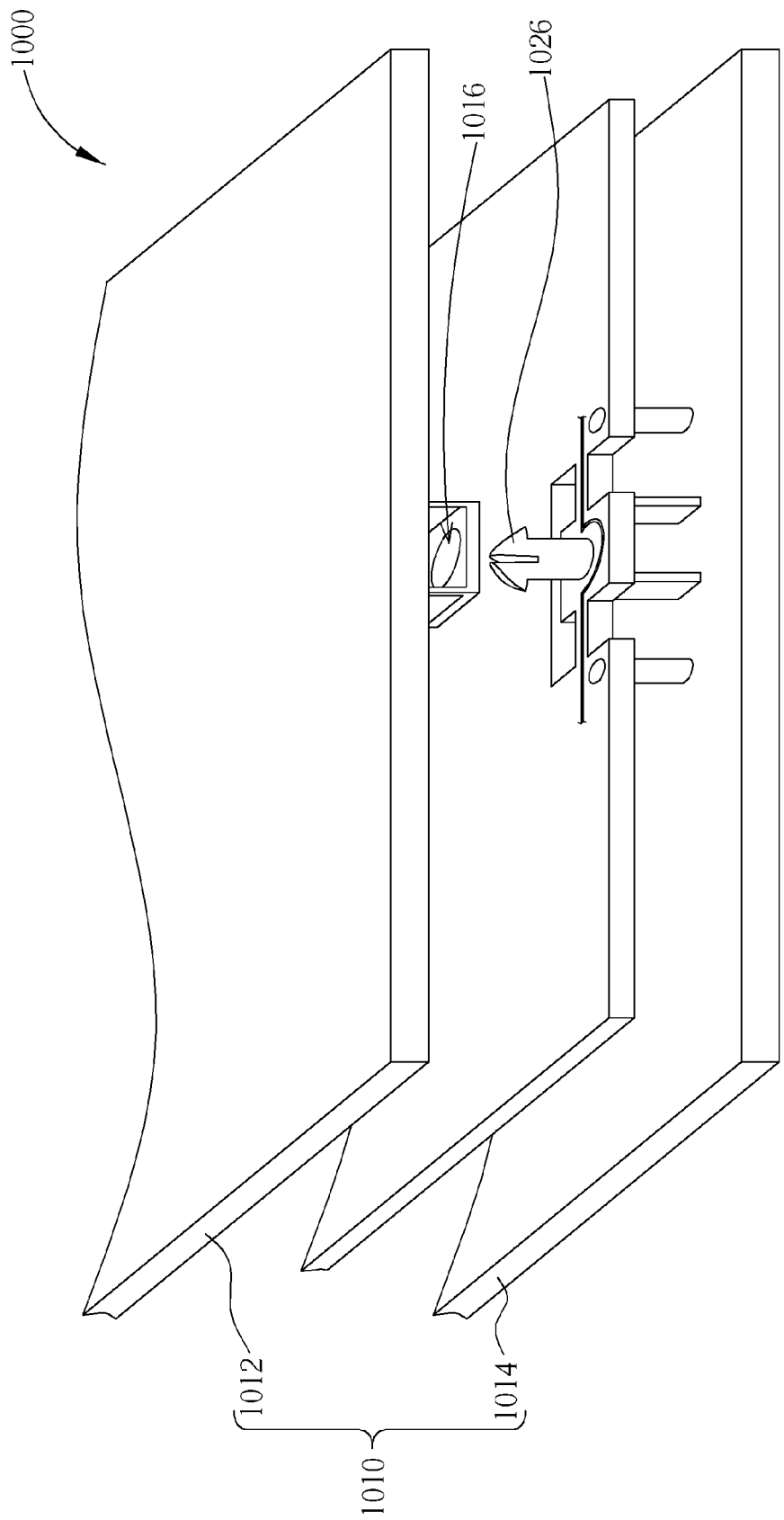
FIG. 10 is a side view illustrating a device having anti-demolition functions according to another embodiment of the present invention.

Please refer to FIG. 10. FIG. 10 is a side view illustrating a device 1000 having anti-demolition functions according to another embodiment of the present invention. The architecture of the device 1000 shown in FIG. 10 is similar to that of the device shown in FIG. 1A, and the major difference between them is that a second connection part 1026 of the device 1000 shown in FIG. 10 is implemented by an anti-dismantle fastener and a first connection part 1016 of the device 1000 shown in FIG. 10 is implemented by a hole. In addition, when a first cover 1012 is engaged with a second cover 1014 of a housing 1010, the second connection part 1026 (i.e., the anti-dismantle fastener) is inserted into the first connection part 1016 (i.e., the hole) in order to fasten each other. Please note that: the anti-dismantle fastener mentioned in this embodiment is similar to the anti-dismantle fastener shown in FIG. 1A, and the hole mentioned in this embodiment is similar to the hole shown in FIG. 1A, and further description is omitted here for brevity.

The abovementioned embodiments are presented merely for describing features of the present invention, and in no way should be considered to be limitations of the scope of the present invention. Certainly, those skilled in the art should appreciate that various modifications of the electronic apparatuses 120, 520, 620, 720, 820, 920 shown in FIG. 1B, FIG. 5A, FIG. 6A, FIG. 7A, FIG. 8A, and FIG. 9A, respectively, may be made without departing from the spirit of the present invention. For example, the features of the electronic apparatus 520 shown in FIG. 5A (such as, the join part 523 has at least one broken line 540) and the features of the electronic apparatus 820 shown in FIG. 8A (such as, there is an L-type groove 880 existed between the first block 821 and the second block 822) can be merged into a new varied embodiment. Besides, the features of the electronic apparatus 520 shown in FIG. 5A (such as, the join part 523 has at least one broken line 540), the features of the electronic apparatus 720 shown in FIG. 7A (such as, the second width d2 of the join part 723 is smaller than the first width d1 of the first block 721 and the second block 722), and the features of the electronic apparatus 820 shown in FIG. 8A (such as, there is an L-type groove 880 existed between the first block 821 and the second block 822) can be merged into another new varied embodiment. Additionally, without departing from the spirit of the present invention, the features of the electronic apparatuses 520, 620, 720, 820, 920 shown in FIG. 5A, FIG. 6A, FIG. 7A, FIG. 8A, and FIG. 9A, respectively, can be combined with the features of the device 1000 having anti-demolition functions (such as, the second connection part 1026 is implemented by an anti-dismantle fastener, and the first connection part 1016 is implemented by a hole) so as to form another new varied embodiment.

Please note that: the abovementioned circuit wire(s) can include dummy circuit wires (i.e., wires without any real link functions) for increasing complexity of the circuit wire (s), in order to increase difficulty of unauthorized use of the circuit wire(s) to the interested parties.

As can be known from the above, the major feature of the present invention is that: the join part will be separated from at least one of the first block and the second block when the first cover and the second cover of the housing are separated from each other, such that the at least one circuit wire forms an open circuited status. In addition, the structure, formed by the join part, the first block and the second block of the electronic apparatus, is not limited to the abovementioned U-type groove or the L-type groove. That is to say, grooves with any shape that can produce a lever force onto the electronic apparatus when dismantling the electronic apparatus so as to achieve the function of easily broking off the join part are feasible, which also conforms to the spirit of the present invention and belongs to the scope of the present invention. Furthermore, another feature of the present invention is focused on reducing the connection strength of the join part. For example, embodiments that are implemented by the broken line, dotted line holes of stamp holes, reducing the width of the join part, and/or any combination of the abovementioned implementations can be adopted to directly snap the join part by use of the force produced from dismantling the first cover and the second cover of the housing.

The abovementioned embodiments are presented merely for describing features of the present invention, and in no way should be considered to be limitations of the scope of the present invention. In summary, the present invention provides a device with anti-dismantle functions. Therefore, by use of the mechanism that the join part will be broken off and separated from at least one of the first block and the second block so as to facilitate at least one circuit wire form an open circuited status when the first cover and the second cover of the housing are separated from each other, attempts for dismantling the electronic apparatus and derived malicious damages can be avoided.

Those skilled in the art will readily observe that numerous modifications and alterations of the device and method may be made while retaining the teachings of the invention.

What is claimed is:

1. A device having anti-demolition functions, comprising:
   a housing, comprising a first cover and a second cover, wherein the first cover comprises a first connection part disposed thereon, wherein the first connection part is fixed on the first cover; and
   an electronic apparatus, disposed in the housing and fixed on the second cover, the electronic apparatus comprising:
      a first block;
      a second block, comprising a second connection part disposed thereon, wherein the second connection part fastens the first connection part when the first cover is engaged with the second cover, wherein the first block and the second block are printed circuit boards (PCB); and
      a join part, for connecting the first block and the second block and having at least one circuit wire passing through, wherein when the first cover and the second cover are separated from each other, the join part is separated from at least one of the first block and the second block, such that the at least one circuit wire are broken into more than one pieces.

2. The device of claim 1, wherein the first connection part is an anti-dismantle fastener and the second connection part is a hole; and when the first cover is engaged with the second cover, the anti-dismantle fastener is inserted into the hole in order to fasten each other.

3. The device of claim 2, wherein an axis of the anti-dismantle fastener comprises a pillar, and a top of the pillar comprises at least one blocking part disposed outwardly and a gap disposed inwardly; and when the anti-dismantle fastener is inserted into the hole, the blocking part penetrates the hole and fastens the hole.

4. The device of claim 1, wherein the second connection part is an anti-dismantle fastener and the first connection part is a hole; and when the first cover is engaged with the second cover, the anti-dismantle fastener is inserted into the hole in order to fasten each other.

5. The device of claim 4, wherein an axis of the anti-dismantle fastener comprises a pillar, and a top of the pillar comprises at least one blocking part disposed outwardly and a gap disposed inwardly; and when the anti-dismantle fastener is inserted into the hole, the blocking part penetrates the hole and fastens the hole.

6. The device of claim 1, wherein there is a U-type groove existed between the first block and the second block.

7. The device of claim 1, wherein the second cover further comprises at least one supporting stilt for supporting the second block.

8. The device of claim 1, wherein when the first cover and the second cover are separated from each other, the first connection part still fastens the second connection part, thereby the join part is separated from at least one of the first block and the second block.

* * * * *